United States Patent [19]

Ragosch et al.

[11] Patent Number: 5,006,727

[45] Date of Patent: Apr. 9, 1991

[54] CIRCUIT ARRANGEMENT FOR ADJUSTING THE AMPLITUDE OF A SIGNAL

[75] Inventors: Ernst P. Ragosch, Hamburg; Henning Schwarz, Reinbek, both of Fed. Rep. of Germany

[73] Assignee: U.S. Philips Corporation, New York, N.Y.

[21] Appl. No.: 421,870

[22] Filed: Oct. 16, 1989

[30] Foreign Application Priority Data

Oct. 19, 1988 [DE] Fed. Rep. of Germany ....... 3835499

[51] Int. Cl.$^5$ .............................................. H03K 5/00
[52] U.S. Cl. .................................... 307/264; 307/491; 307/494
[58] Field of Search ............... 307/254, 264, 491, 494, 307/529; 330/254, 257

[56] References Cited

U.S. PATENT DOCUMENTS

| | | | |
|---|---|---|---|
| 4,379,995 | 4/1983 | Yamada et al. | 330/254 |
| 4,471,320 | 9/1984 | Frey | 330/254 |
| 4,520,282 | 5/1985 | Watanabe et al. | 307/494 |

Primary Examiner—John Zazworsky
Attorney, Agent, or Firm—Bernard Franzblau

[57] ABSTRACT

A circuit arrangement for adjusting the amplitude of a signal includes first and second differential transistor-amplifiers. One of said amplifiers is arranged to receive the signal via its main-current-path input and the other amplifier is arranged to receive a direct current supply corresponding to the d.c. component of the signal. The amplitude of the signal is adjustable by means of a control voltage applied to the cross-coupled control terminals of the differential amplifiers, and the amplitude adjusted signal is available on two cross-coupled main-current path outputs of the amplifier. The circuit can be energized with low supply voltages and at the same time can handle large amplitudes of the signal to be adjusted by means of a current summing circuit in which an output direct current corresponding to the direct current supplied is subtracted from the amplitude adjusted signal. Current mirror circuits apply the signal, the direct current supply and the output direct current to the first and second differential amplifiers and the current summing circuit resepctively. Voltage sources are provided from which the signal, the supply direct current and the output direct current can be derived.

15 Claims, 2 Drawing Sheets

CIRCUIT ARRANGEMENT FOR ADJUSTING THE AMPLITUDE OF A SIGNAL

BACKGROUND OF THE INVENTION

This invention relates to a circuit arrangement for adjusting the amplitude of a signal, the arrangement comprising two differential transistor-amplifiers, one of said amplifiers being arranged to receive the signal via its main-current-path input and the other amplifier being arranged to receive a supply direct current corresponding to the d.c. component of the signal, the amplitude of the signal being adjustable by means of a control voltage applied to the cross-coupled control terminals of the differential amplifiers, and the signal whose amplitude has been adjusted being available on two cross-coupled main-current-path outputs.

Such a circuit arrangement is known from DE-PS 33 31 200. Said arrangement is used in an electronic potentiometer for adjusting the amplitude of the signal in dependence upon a control voltage. The signal is applied to the interconnected emitters constituting the signal input of a differential amplifier. The signal whose amplitude has been adjusted is available on two cross-coupled collecter terminals of the respective transistors of the differential amplifier. The coupled collecter terminals are further connected to a terminal of a voltage source via a load resistor, which voltage source supplies a supply voltage which is positive relative to ground potential. The signal whose amplitude has been adjusted is thus available in the form of a voltage across the load resistor.

In the known circuit arrangement the voltage representing the signal whose amplitude has been adjusted, the voltages across the differential amplifiers, and the voltage representing the input signal whose amplitude is to be adjusted, appear between the positive terminal of the voltage source and ground, i.e. the supply voltage should be at least equal to the sum of these three voltages.

SUMMARY OF THE INVENTION

It is an object of the invention to provide a circuit arrangement of the type defined in the opening paragraph which can be powered with small supply voltages and which nevertheless allows signals of high amplitudes to be processed.

According to the invention, this object is achieved by means of a current-summing circuit which enables an output direct current corresponding to the supply current to be subtracted from the signal whose amplitude has been adjusted. Current mirror circuits are provided for applying the signal, the direct current supply and the output direct current respectively to the differential amplifiers of a multiplier circuit and the current-summing circuit respectively, and voltage sources are provided from which the signal, the direct current supply and the output direct current can be derived.

Instead of the voltage drive used in the prior-art circuit, the circuit arrangement in accordance with the invention employs a current drive. In this way it is avoided, as far as possible, that in the circuit arrangement voltages occur which limit the amplitude range of the input signal relative to the supply voltage. As a result of this, the supply voltage can be reduced to a value which is only slightly larger than the maximum signal amplitude. In addition, the steps in accordance with the invention provide a highly constant direct voltage level at the output, i.e. in the signal whose amplitude has been adjusted, because the current drive of the differential transistor-amplifier, which is arranged as a multiplier circuit, results in an internal compensation of the d.c. components in the circuit arrangement. For a distortion-free drive with large signal amplitudes, it is also important that the d.c. potential on the output, i.e. in the signal whose amplitude has been adjusted, remains constant independently of the signal amplitude. This is achieved in that the currents applied to the multiplier circuit are derived from voltage sources.

The symmetry of the circuit arrangement and hence the constancy of the d.c. potential in the signal whose amplitude has been adjusted is further improved by means of a further current-mirror circuit for transferring the signal from the differential amplifiers to the current-summing circuit, and preferably also by an additional current-mirror circuit coupled to the two other interconnected main-current-path outputs. The further current mirror circuit for transferring the signal, in particular, enables a precise signal transfer to be obtained despite the smaller voltage difference between the main-current-path outputs of the differential amplifiers and the terminal of the supply-voltage source from which they are energized, while the additional current-mirror circuit also provides voltage symmetry on the two other main-current-path outputs.

In a further embodiment the circuit arrangement in accordance with the invention comprises an additional voltage source to derive an additional direct current which can be superimposed on the signal to adjust its d.c. component. Preferably, this enables the total direct current superimposed on the a.c. component of the signal to be adjusted so as to correspond to the supply direct current and hence the output direct current. This results in an even better compensation for the d.c. components in the circuit arrangement.

Preferably, the voltage source from which the output direct current can be derived is adapted to supply an output direct voltage for adjusting the potential of the signal whose amplitude has been adjusted. This double use of the voltage source simplifies the circuit arrangement and reduces possible errors caused by manufacturing tolerances.

Preferably, the direct current supply and the output direct current can be derived from a common voltage source via a common current mirror circuit. This step also serves to save components and to reduce the effects of manufacturing tolerances. This is achieved, in particular, by the use of a current mirror circuit comprising one input branch and a plurality of output branches. Moreover, the arrangement can now be simplified in that a d.c. bias voltage for the differential transistor-amplifiers can also be derived from the common voltage source.

BRIEF DESCRIPTION OF THE DRAWING

The invention will now be described in detail reference to the accompanying drawing in which.

DESCRIPTION OF THE PREFERRED EMBODIMENTS

Figure 1:
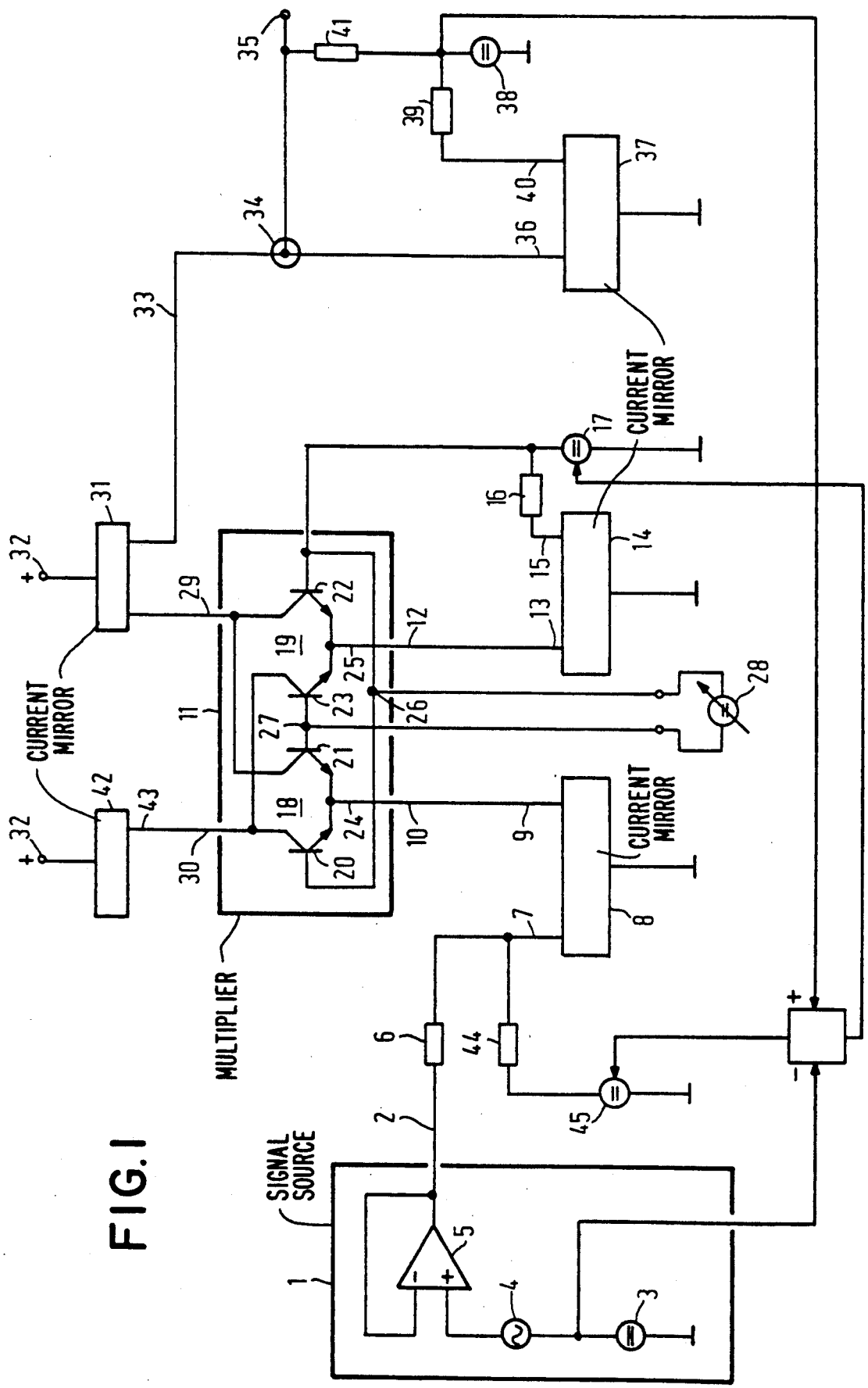
FIGS. 1 and 2 show first and second preferred embodiments of the invention, respectively.

FIG. 1 shows an embodiment in which a signal whose amplitude is to be adjusted is available on the output 2 of a signal source 1. For simplicity the internal circuit arrangement of the signal source 1 is represented as an equivalent circuit comprising a direct voltage source 3 for the d.c. component of the signal, an alternating voltage source 4 for the a.c. component of the signal, and a buffer amplifier 5. The sum of the voltages from the direct-voltage source 3 and the alternating voltage source 4 is available at the output 2 with a low source impedance. The signal voltage at the output 2 produces a signal current in the input branch 7 of a signal current mirror 8 via a series resistor 6.

The signal current mirror 8, which is connected to ground, has its output branch 9 connected to a signal input 10 of a multiplier circuit 11 to apply the signal current via this branch. A direct current supply corresponding to the d.c. component of the signal current at the signal input 10, i.e. the current component produced by the direct voltage source 3, is supplied to the multiplier current 11 via a direct current supply input 12. The direct current supply is applied to the direct current supply input 12 via the output branch 13 of a supply current mirror 14, whose input branch 15 is connected to voltage source 17 to derive the supply direct current via a resistor 16. The supply current mirror 14 is also connected to ground.

The multiplier circuit 11 comprises two differential transistor-amplifiers 18 and 19 each comprising two transistors 20, 21 and 22 23, respectively, whose main current-path terminals —in the present case emitter terminals of the bipolar transistors —are pairwise interconnected in each of the differential amplifiers 18 and 19, respectively. The pairwise interconnection of the emitter terminals of the transistors 20, 21 and 22, 23 respectively constitutes a main-current-path input 24 and 25 respectively for the corresponding differential amplifiers. Moreover, the first and the second transistors 20, 22 and 21, 23, respectively of the two differential amplifiers 18, 19 are coupled via their control terminals —in the present case the base terminals of the bipolar transistors. A control-voltage source 28, which supplies a control voltage in the form of a variable direct voltage, is arranged between the nodes 26 and 27 at which the control terminals are coupled to each other.

The first transistors 20 and 22 of the differential amplifiers 18 and 19 respectively are cross-coupled to the second transistors 23 and 21 respectively of the differential amplifiers 19 and 18 respectively via the second main-current-path terminals, in the present case the collector terminals of the bipolar transistors. Thus, these connections are complementary to those of the control terminals of the transistors 20 to 23, i.e. the control terminal and the second main-current-path terminal of each of the transistors 20 to 23 are connected to different transistors of the respective differential amplifier 18 or 19.

The current corresponding to the signal whose amplitude has been adjusted appear on the second main-current-path terminals of the transistors 20 to 23. These terminals, which are therefore also referred to as main-current-path outputs, constitute signal outputs 29 and 30 with their above-described connections. The signal is transferred from the first signal output 29 to a current summing circuit 34 via a further current mirror circuit 31, which is connected to a positive terminal 32 of a voltage source, and via a line 33. This current summing circuit is further connected to an output 35 for the signal whose amplitude has been adjusted and an output branch 36 of an output current mirror 37 which is connected to ground. An output direct current, which is derived from an output direct voltage source 38 via a resistor 39 and the input branch 40 of the output current mirror 37, flows in the output branch 36. The output direct voltage source 38 moreover supplies a d.c. bias voltage to the output 35 via a further resistor 41, and appears on said output as a d.c. component of the signal whose amplitude has been adjusted. In the current summing circuit 34 the output direct current in the output branch 36 is substracted from the signal on the line 33 whose amplitude has been adjusted and which still contains a d.c. component. The arrangement is dimensioned in such a way that the output direct current in the output branch 36 corresponds to the supply direct current on the direct current supply input 12 of the multiplier circuit 11. As a result, the d.c. components of the currents in the current summing circuit 34 exactly cancel one another and the current summing circuit 34 only supplies a pure a.c. component to the output 35.

The second signal output 30 of the multiplier circuit 11 is also connected to the positive terminal 32 of the voltage source which provides the supply voltage (supply voltage source), namely via an additional current mirror circuit 42. This circuit only comprises an input branch 43 and serves to obtain a voltage difference between the positive terminal 32 of the voltage source and the second signal output 30, which corresponds to the voltage difference between the positive terminal 32 and the first signal output 29. This results in symmetrical potential relationships across the multiplier circuit 11. The additional current mirror circuit 42 is of a construction corresponding to that of the input branch of the further current mirror circuit 31 and in the simplest case it comprises a diode or a diode-connected transistor.

The input branch 7 of the signal current mirror 8 is further connected to an additional voltage source 45 via an additional resistor 44, from which source an additional direct current can be derived and fed into the input branch 7 of the signal current mirror 8 via the additional resistor 44. This additional direct current is mirrored in the output branch 9 of the signal current mirror 8 and is applied to the signal input 10 of the multiplier circuit 11 and is thus superimposed on the signal to adjust its d.c. component. Therefore, the additional voltage source 45 and the additional resistor 44 are dimensioned in such a way that the additional direct current provides exact compensation for the d.c. component of the current in output branch 9 by means of the output direct current in the output branch 36, so as to obtain an optimum choice of the operating point of the differential amplifier 18. The additional voltage source may have a fixed setting, but it is alternatively possible, as is indicated, to control the additional voltage source 45 in accordance with the difference between the output direct voltage from the output direct voltage source 38 and the d.c. component of the signal from the direct voltage source 3 of the signal source 1. Moreover, the voltage source 17 can be influenced to adjust and further optimize the operating point of the multiplier circuit 11.

Figure 2:
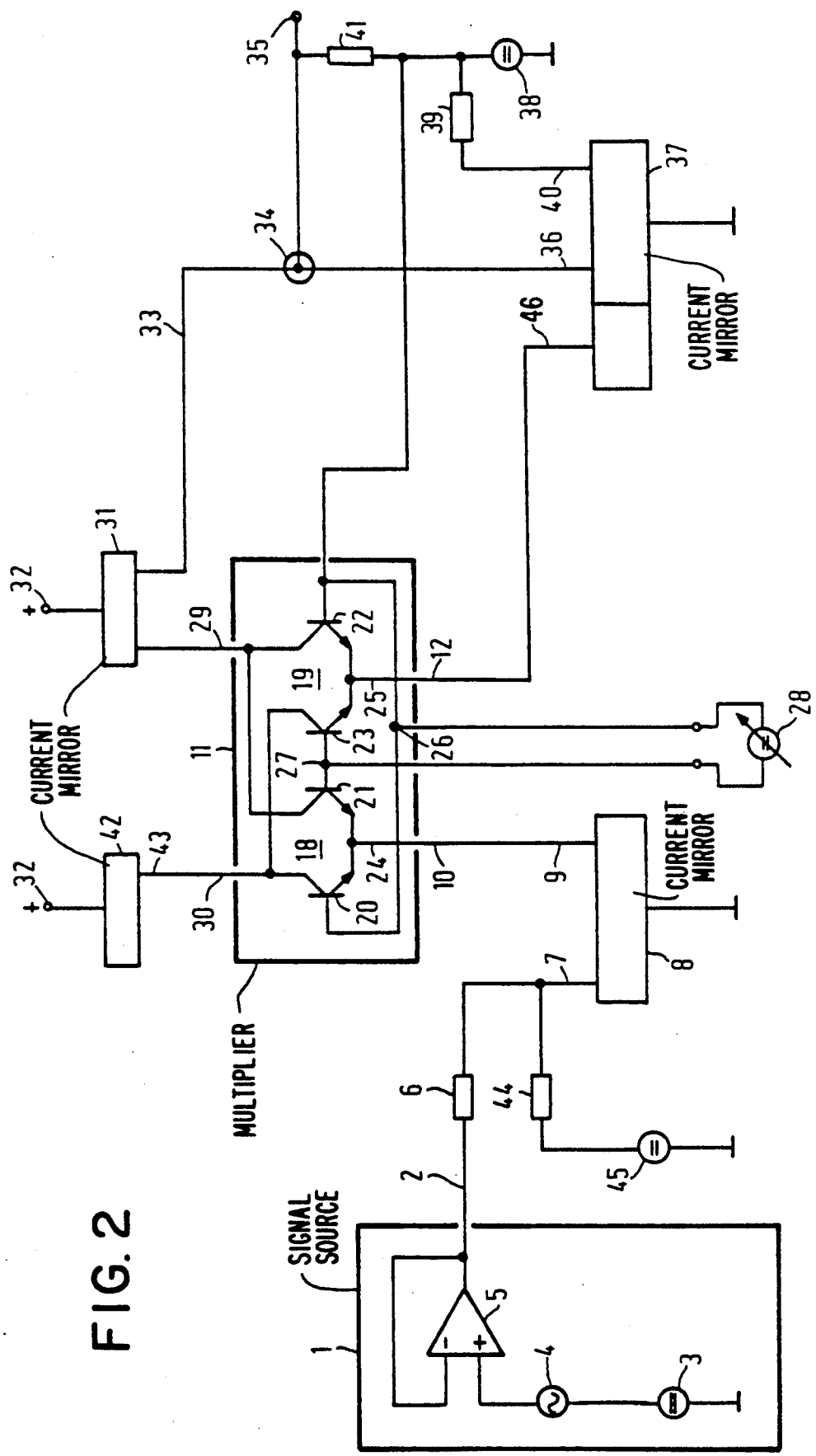

In a modification of the invention shown in FIG. 2 of the drawing, the direct current supply at the supply direct current input 12 is derived directly from the output current mirror 37, which for this purpose comprises a further output branch 46, which in common with the output branch 36 is controlled by the current in the input branch 40 and which is connected directly to the supply direct current input 12. Moreover, the output direct voltage is now applied directly from the output direct voltage source 38 to the node 26 between the control terminals of the first transistors 20, 22. In this case the supply current mirror 14, the resistor 16 and the voltage source 17 of FIG. 1 are dispensed with. The output current mirror 37 now constitutes a current mirror circuit which is common to the direct current supply and the output direct current and by means of which these currents are derived from the output direct voltage source 38, which thus functions as a common voltage source.

In the embodiments of the circuit arrangement the signal source 1, the multiplier circuit 11, the current summing circuit 34 and the signal-processing circuits, not shown, which are also connected to the output 35, are arranged in series with respect to the signal flow in the arrangement and in parallel with respect to the supply voltage source. This enables operation at a lower supply voltage. As as result of the very constant output direct voltage, to which the potential of the signal whose amplitude has been adjusted is set, large-amplitude signals can also be processed without distortion.

We claim:

1. A circuit arrangement for adjusting the amplitude of a signal comprising:
   first and second differential transistor amplifiers having cross-coupled control terminals and having two cross-coupled main current path outputs,
   a signal source,
   a first current mirror circuit coupled to said signal source and to a main current path input of one of said amplifiers to apply to said input the signal whose amplitude is to be adjusted,
   a supply voltage source,
   a second current mirror circuit coupled to said supply voltage source and to main current path input of the other one of said amplifiers to apply to said latter input a supply direct current corresponding to a d.c. component of said signal,
   means for applying a control voltage to the cross-coupled terminals of the differential amplifiers in order to adjust the amplitude of said signal, whereby the amplitude adjusted signal appears on said two cross-coupled main current path outputs,
   a current summing circuit coupled to said two-cross-coupled outputs,
   a further voltage source, and
   a third current mirror circuit coupled to said further voltage source and to said current summing circuit whereby said current summing circuit substracts an output direct current corresponding to the supply direct current from the amplitude adjusted signal.

2. A circuit arrangement as claimned in claim 1, further comprising a fourth current-mirror circuit for transferring the amplitude adjusted signal from the differential amplifiers to the current-summing circuit.

3. A circuit arrangement as claimed in claim 2, further comprising an additional current-mirror circuit coupled to two other interconnected main-current-path outputs of the differential amplifiers.

4. A circuit arrangement as claimed in claim 3, further comprising an additional voltage source coupled to said first current mirror circuit so as to derive an additional direct current which is superimposed on the signal to adjust its d.c. component.

5. A circuit arrangement as claimed in claim 4, wherein the further voltage source supplies an output direct voltage for adjusting a potential of the amplitude adjusted signal.

6. A circuit arrangement as claimed in claim 1, further comprising an additional voltage source coupled to said first current mirror circuit so as to derive an additional direct current which is superimposed on the signal to adjust its d.c. component.

7. A circuit arrangement as claimed in claim 6, wherein the further voltage source supplies an output direct voltage for adjusting a potential of the amplitude adjusted signal.

8. A circuit arrangement as claimed in claim 3 wherein the supply voltage source and the further voltage source comprises a single common voltage source and said second and third current mirror circuits comprise a single common current mirror circuit whereby the supply direct current and the output direct current are derived from the common voltage source via the common current-mirror circuit.

9. A circuit arrangement as claimed in claim 1, wherein the voltage source which supplies the an output direct voltage for adjusting a potential of the amplitude adjusted signal.

10. A circuit arrangement as claimed in claim 2, further comprising an additional voltage source coupled to said first current mirror circuit so as to derive an additional direct current which is superimposed on the signal to adjust its d.c. component.

11. A circuit arrangement as claimed in claim 2, wherein the further voltage source supplies output direct current is adapted to supply an output direct voltage for adjusting a potential of the amplitude adjusted signal.

12. A circuit arrangement as claimed in claim 2, wherein the supply voltage source and the further voltage source comprise a single common voltage source and said second and third current mirror circuits comprise a single common current mirror circuit whereby the supply direct current and the output direct current are derived from the common voltage source via the common current-mirror circuit.

13. A circuit arrangement as claimed in claim 1 further comprising a circuit output terminal coupled to said current summing circuit and at which circuit output terminal the amplitude adjusted signal is produced, and
   means for coupling said further voltage source to said circuit output terminal to supply thereto an output direct voltage for adjusting the voltage level of said amplitude adjusted signal.

14. A circuit arrangement as claimed in claim 1 further comprising an adjustable voltage source coupled to said first current mirror circuit, to said signal source and to said further voltage source and responsive to d.c. voltages of said voltage sources and said signal source to derive a component of direct current which is combined with said signal to adjust a d.c. component of the signal.

15. A circuit arrangement for adjusting the amplitude of a signal comprising:
   first and second differential transistor amplifiers having cross-coupled control terminals and having two cross-coupled main current path outputs,
   a signal source,
   a first current mirror circuit coupled to said signal source and to a main current path input of one of said amplifiers to apply to said input the signal whose amplitiude is to be adjusted, a common voltage source, a common current mirror circuit coupled to said common voltage source and to a main current path input of the other one of said amplifiers to apply to said latter input a supply direct current corresponding to a d.c. component of said signal, means for applying a control voltage to the cross-coupled control terminals of the differential amplifiers in order to adjust the amplitude of said signal, whereby the amplitude adjusted signal appears on said two cross-coupled main current path outputs, a current summing circuit coupled to said two cross-coupled outputs, means for coupling said common current mirror circuit to said current summing circuit whereby said current summing circuit subtracts an output direct current corresponding to the supply direct current from the amplitude adjusted signal.

* * * * *